(12) United States Patent
Cook (10) Patent No.: US 6,432,471 B1
(45) Date of Patent: Aug. 13, 2002

(54) METHOD FOR GENERATING AN ANTI-REFLECTION COATING FOR A LASER DIODE

(75) Inventor: Christopher Cook, Bedford, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 0 days.

(21) Appl. No.: 09/436,304

(22) Filed: Nov. 8, 1999

Related U.S. Application Data (60) Provisional application No. 60/107,670, filed on Nov. 9, 1998.

(51) Int. Cl.$^7$ .............................. B05D 5/06; B05D 1/36
(52) U.S. Cl. ................................ 427/10; 427/8; 427/9; 427/162; 427/402
(58) Field of Search .................... 427/8, 9, 10, 162, 427/402, 419.3; 362/800; 359/333; 324/76.11

(56) References Cited

U.S. PATENT DOCUMENTS

| | | | | |
|---|---|---|---|---|
| 5,354,575 A | * | 10/1994 | Dagenais et al. | ............. 427/10 |
| 5,425,964 A | * | 6/1995 | Southwell et al. | ............ 427/10 |
| 5,483,378 A | * | 1/1996 | Rahn | ........................... 359/586 |
| 5,980,975 A | * | 11/1999 | Nomura et al. | ................ 427/10 |
| 6,096,371 A | * | 8/2000 | Haaland et al. | ................ 427/10 |

* cited by examiner

Primary Examiner—Shrive P. Beck
Assistant Examiner—Wesley Markham
(74) Attorney, Agent, or Firm—Testa, Hurwitz & Thibeault, LLP (57) ABSTRACT

A method of generating an anti-reflection optical coating on a laser diode includes determining a preliminary design for the coating, fabricating the coating on a first laser diode using an in-situ optical monitoring technique and measuring the performance of the laser diode. The steps of modifying the anti-reflection coating on the laser diode and measuring the performance of the laser diode are repeated until a performance maximum is determined. Another anti-reflection coating is fabricated a second laser diode and the performance of the laser diode is measured. Again, the steps of modifying the anti-reflection coating on the laser diode and measuring the performance of the laser diode are repeated until another performance maximum is determined. The above steps are repeated with additional laser diodes, as necessary, until a global performance maximum is determined. The coating parameters for the anti-reflection coating corresponding to the global performance maximum are used as the final anti-reflection coating design.

10 Claims, 7 Drawing Sheets

METHOD FOR GENERATING AN ANTI-REFLECTION COATING FOR A LASER DIODE

CROSS-REFERENCE TO RELATED APPLICATIONS

This application claims priority to provisional U.S. patent application Ser. No. 60/107,670 which was filed on Nov. 9, 1998.

GOVERNMENT INTEREST

This invention was made with government support under F19628-95C-0002 awarded by the United States Air Force. The government may have certain rights in the invention.

FIELD OF THE INVENTION

The invention relates generally to a method for generating an anti-reflection coating for an optical gain element, and in particular to determining improved coating parameters for an anti-reflection coating for a laser diode.

BACKGROUND OF THE INVENTION

Anti-reflection coatings are known to reduce the reflectivity of various optical components, such as lenses and windows, thereby increasing the transmittance of the optical components. Optical gain elements, such as laser diodes, can also be coated to improve their performance. Unfortunately, optical gain elements provide significant challenges to the processes of designing and fabricating anti-reflection coatings.

Many optical gain elements include a waveguide or active region in which optical energy is generated and/or amplified. Modeling these elements requires a knowledge of the waveguide structure (e.g., refractive index and dimensional parameters) and the distribution of optical energy in the active region. The effective refractive index and optical mode confinement can vary as operating parameters, such as the current or voltage applied to the element, are changed. Thus, manufacturers often have difficulties designing and fabricating laser diodes with highly dependable performance specifications.

The optical coating process typically introduces additional performance uncertainties to the performance characteristics of the anti-reflection coated optical gain element. Due to variations in process parameters between coating facilities, anti-reflection coatings fabricated according to a specific design in one facility generally have different performance characteristics than anti-reflection coatings fabricated to the same design in other facilities. In addition, variations in the supplied materials used in the coatings (e.g., refractive index variations) and variations in the characteristics of the optical gain element prior to coating (e.g., variations in output beam characteristics) also result in variations in the performance of the coated elements. Consequently, the performance of a system utilizing anti-reflection coated optical gain elements is generally dependent on the source of the optical gain elements, the source of the coating materials and the particular coating facility used to fabricate the coatings.

SUMMARY OF THE INVENTION

The invention relates to a method for generating an anti-reflection coating on an optical gain element. According to one embodiment, the method includes determining coating parameters for an anti-reflection coating based on known characteristics of the optical gain element and fabricating the anti-reflection coating according to the coating parameters on an optical gain element. The performance of the coating on a first optical gain element is measured and one of the coating parameters is modified in response to the measurement. In one embodiment, measuring the performance of the coating on the first optical gain element includes measuring the lasing threshold current of the first optical gain element. In another embodiment, modifying one of the coating parameters includes changing the thickness of a coating layer. In another embodiment, modifying one of the coating parameters includes changing the refractive index of a coating layer. An anti-reflection coating based on the modified design is fabricated on a second optical gain element. The performance of the anti-reflection coating on the second optical gain element is measured. Improved coating parameters are determined in response to the measurements of the anti-reflection coatings on the first and second optical gain elements, respectively. The coating parameters may include the identities of coating materials, refractive indices of the coating materials and/or coating layer thicknesses.

In a further embodiment, the steps of fabricating the anti-reflection coating on the first optical gain element and measuring its performance includes fabricating the anti-reflection coating on the first optical gain element, measuring the performance of the anti-reflection coating on the first optical gain element, modifying a second coating parameter based on the measured performance of the anti-reflection coating on the first optical gain element, fabricating a modified anti-reflection coating on the first optical gain element based on the modified second coating parameter and measuring a performance of the modified anti-reflection coating on the first optical gain element.

The invention also relates to an optical gain element having an anti-reflection coating made by the above method. In one embodiment, the optical gain element is a laser diode.

BRIEF DESCRIPTION OF THE DRAWINGS

The foregoing and other objects, features and advantages of the invention will become apparent from the following more particular description of preferred embodiments of the invention, as illustrated in the accompanying drawings. The drawings are not necessarily to scale, emphasis instead being placed on illustrating the principles of the present invention.

DESCRIPTION OF THE INVENTION

As detailed below, the invention is generally directed to a method for generating an anti-reflection coating on an optical gain element based in part on an empirical determination. More specifically, according to one embodiment, the method of the invention includes determining an initial anti-reflection coating design based on predetermined criteria. The predetermined criteria may be, for example, based on desired characteristics of an optical beam generated by the optical gain element. By way of another example, the predetermined criteria may be based on the performance of a system which includes the optical gain element. The predetermined criteria can be based on a simplified model of a more complex optical configuration. For example, the predetermined criteria may be based on normally incident plane wave light even though the optical beam incident on the coating is highly divergent.

In one embodiment, an anti-reflection coating based on an initial coating design is generated on an optical gain element. The optical gain element may be, for example, a laser diode or an optically pumped semiconductor laser. The anti-reflection coating includes a first layer and a last layer with respective predetermined thicknesses. The performance of the optical gain element is measured. The steps of increasing the thickness of the last layer and measuring the performance of the optical gain element are repeated until a local performance maximum is determined. The increases in thickness are approximately equal to the uncertainty in fabricating a given layer thickness. If the performance of the optical gain element is observed to decrease after the first increase in thickness of the last layer, no local performance maximum will be found. Thus, it is important that the starting (i.e., initial) thickness of the last layer be significantly less than the preliminary design thickness for the last layer to ensure a local maximum can be determined with a single optical gain element (i.e., to avoid the need to coat another optical gain element to the same first layer thickness and a smaller starting thickness for the last coating layer). Another anti-reflection coating having a different first layer thickness is generated on a second optical gain element and its performance is measured. The steps of increasing the last layer thickness on the second optical gain element and measuring the resulting performance of the second optical gain element are repeated until a local performance maximum is again determined. The process is repeated with additional optical gain elements to determine respective local performance maxima until a global performance maximum is determined. Coating parameters corresponding to the global performance maximum describe the preferred anti-reflection coating design for the optical gain element. If the initial coating parameters are close to optimum values, then as few as three optical gain elements can be sufficient to determine the preferred design. In one embodiment, increasing the thickness includes increasing the optical thickness of a layer, thus the product of the index of refraction and the physical thickness is increased. In another embodiment, the method is applicable to a single-layer (i.e., exclusive layer) anti-reflection coating by varying the index of refraction and the physical thickness of the exclusive layer individually.

Figure 1:
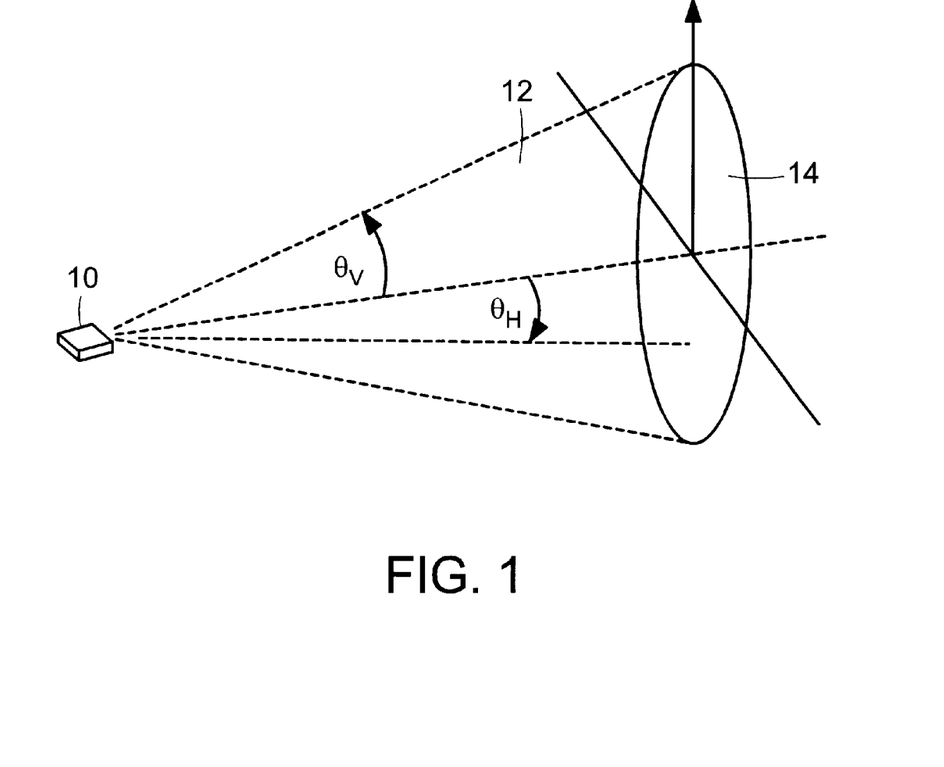
FIG. 1 is a diagram of an operating optical gain element.

FIG. 1 depicts a laser diode 10 having a diverging output beam 12 with characteristic divergence angles $\theta_H$ and $\theta_V$ resulting in an elliptical far-field pattern 14. The performance of the laser diode 10 can be any measurable parameter or combination of measurable parameters associated with its optical output. For example, measurable performance parameters include the optical output power or the intensity distribution 14 of the output beam 12, the modulation depth of modes in the optical spectrum of the output beam 12, the lasing threshold current and the forward voltage across the laser diode 10. Measurable performance parameters associated with systems using laser diodes 10 include, for example, wavelength tuning range, side-mode suppression in external cavity systems and total gain in amplifier systems.

Figure 2:
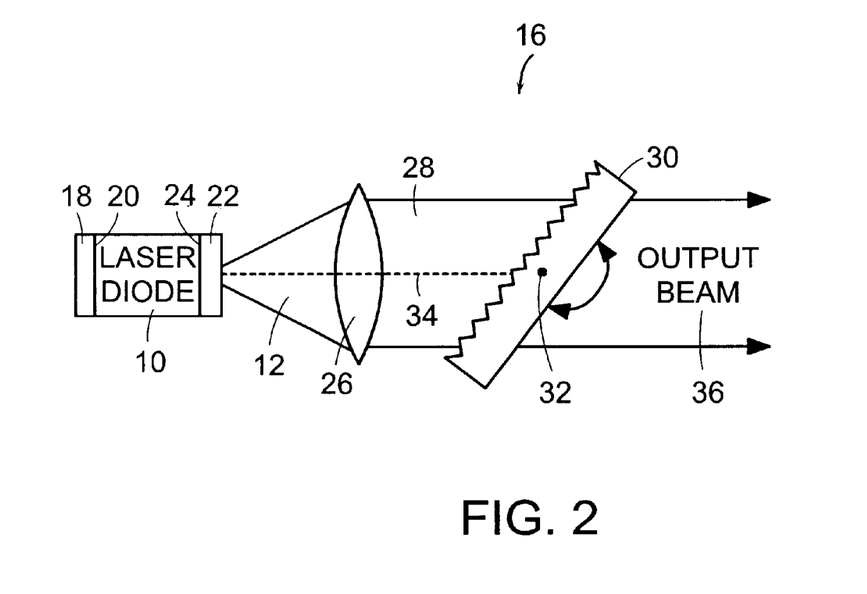
FIG. 2 is a block diagram of an external cavity optical source according to one embodiment of the invention.

FIG. 2 depicts an external cavity laser diode system 16 using a laser diode 10. The laser diode 10 has a high reflectance coating 18 on one facet 20 and a two layer anti-reflection coating 22 on the opposite facet 24. The divergent output beam 12 is substantially collimated by a lens 26 into a beam 28 which passes through a transmissive grating 30. The grating 30 is rotated about an axis 32 (normal to page) to selectively reflect optical energy in the beam 28 at a substantially single wavelength back through the lens 26, anti-reflection coating 22 and the laser diode 10. If the laser diode 10 is operated with sufficient drive current to support optical gain, the cavity defined by the high reflection coating 18 and the grating 30, and including the gain medium of the laser diode 10, generates laser energy at the reflected wavelength. Under this condition, the energy in the output beam 36 is substantially at the lasing wavelength. The lasing wavelength is changed (i.e., tuned) by rotating the grating 30 about an axis 32 perpendicular to the beam axis 34. As the wavelength is tuned, the optical output power can increase or decrease. The total wavelength tuning range and the amplitude of the variations (i.e., ripple) in the optical power during wavelength tuning can be measured to determine the quality, or performance, of the anti-reflection coating 22.

Figure 3:
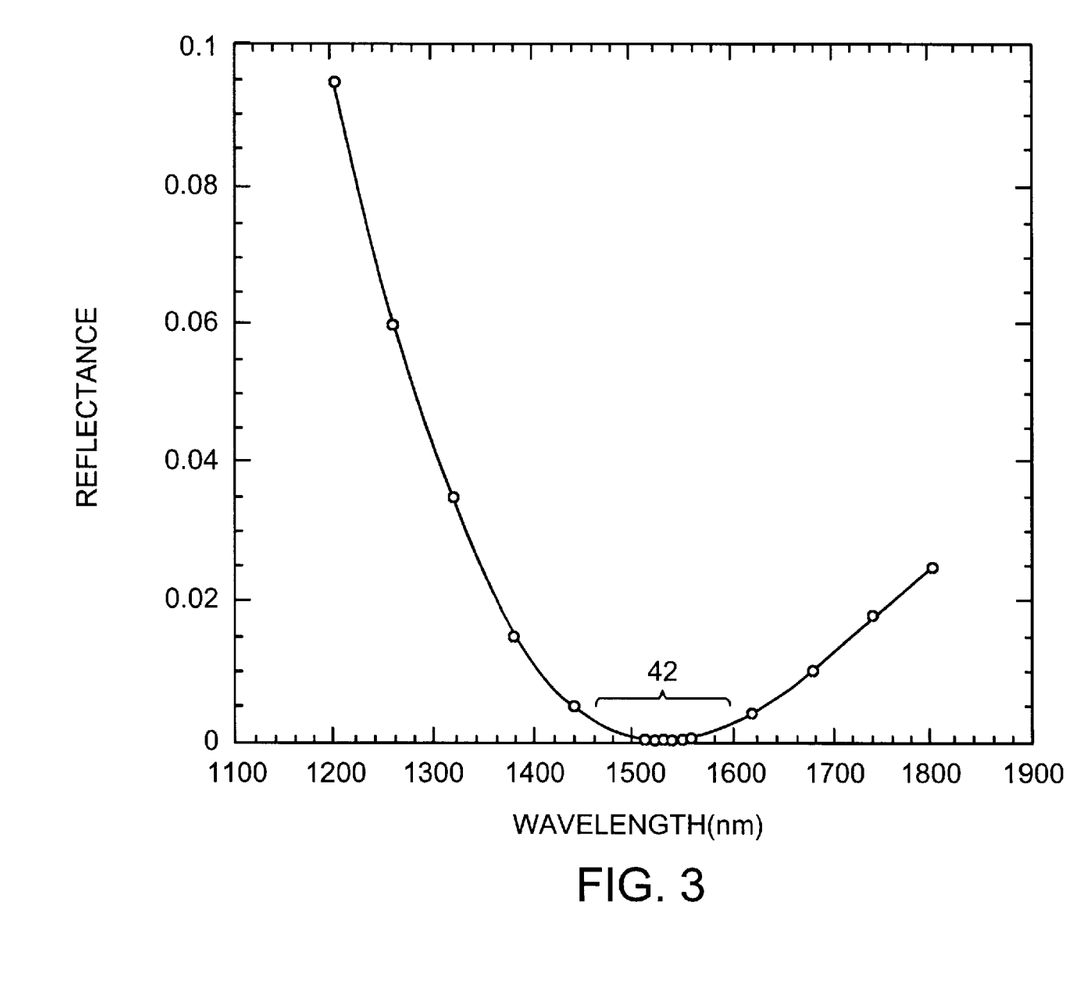
FIG. 3 is a graphical representation of an illustrative relationship of reflectance as a function of wavelength for a two-layer anti-reflection coating.

FIG. 3 shows an exemplary reflectance spectrum of a two layer anti-reflection coating as a function of wavelength for the anti-reflection coating 22 of FIG. 2. The broad spectral region 42 of low reflectance allows the external cavity laser diode system 16 to be tuned over a wide wavelength range.

Figure 4:
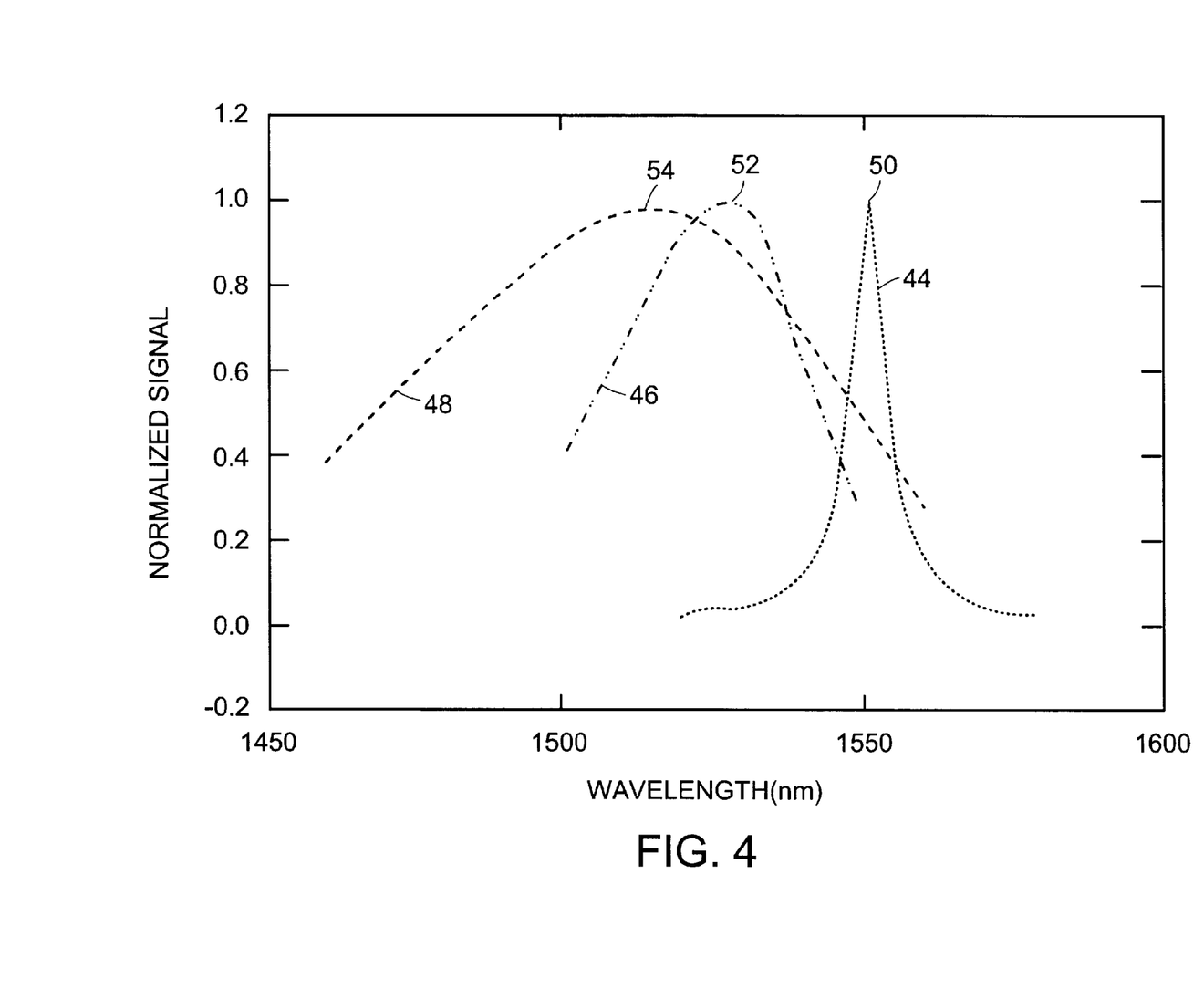
FIG. 4 is a graphical representation of illustrative amplified spontaneous emission spectra as a function of wavelength for an optical gain element.

FIG. 4 shows the normalized amplified spontaneous emission (ASE) spectra 44, 46 and 48 of a laser diode 10 having a large divergence output beam. The ASE spectrum 44 of the laser diode 10 without an anti-reflection coating exhibits a relatively narrow gain peak 50 at approximately 1550 nm. After fabricating an anti-reflection coating on one facet of the laser diode 10, the ASE spectrum 46 is broader and has a peak 52 at a shorter wavelength. Fabricating an anti-reflection coating on the opposite facet of the laser diode results in an ASE spectrum 48 with further spectral broadening and a peak 54 at an even shorter wavelength. Thus, decreasing the reflectance of the anti-reflection coating 22 leads to a broader spectral gain bandwidth and, therefore, a broader tuning range for the external cavity configuration of FIG. 2.

The number of coating layers necessary to achieve a low reflectance optical coating is typically a function of the required wavelength range, the angular distribution of the incident light and the maximum acceptable reflectance. For example, increasing the wavelength range and/or decreasing the maximum acceptable reflectance often requires increasing the number of coating layers in the design. For many applications, however, a one or two layer anti-reflection coating is sufficient. Table 1 lists by way of example the coating parameters for a preliminary design of a two layer anti-reflection coating for a gallium arsenide (GaAs) laser diode operating at 1.50 μm.

TABLE 1

Preliminary Coating Parameters for a Two-Layer Anti-Reflection Coating at λ = 1.50 μm.

| LAYER | OPTICAL THICKNESS | PHYSICAL THICKNESS | REFRACTIVE INDEX (n) | MATERIAL |
|---|---|---|---|---|
| SUBSTRATE | 0.0000 | 0.0000 | 3.3728 | GaAs |
| 1 | 0.1693 | 0.1057 | 1.6026 | $Al_2O_3$ |
| 2 | 0.1578 | 0.0740 | 2.1337 | $TiO_2$ |
| 3 | 0.0000 | 0.0000 | 1.0000 | Air |

Figure 5:
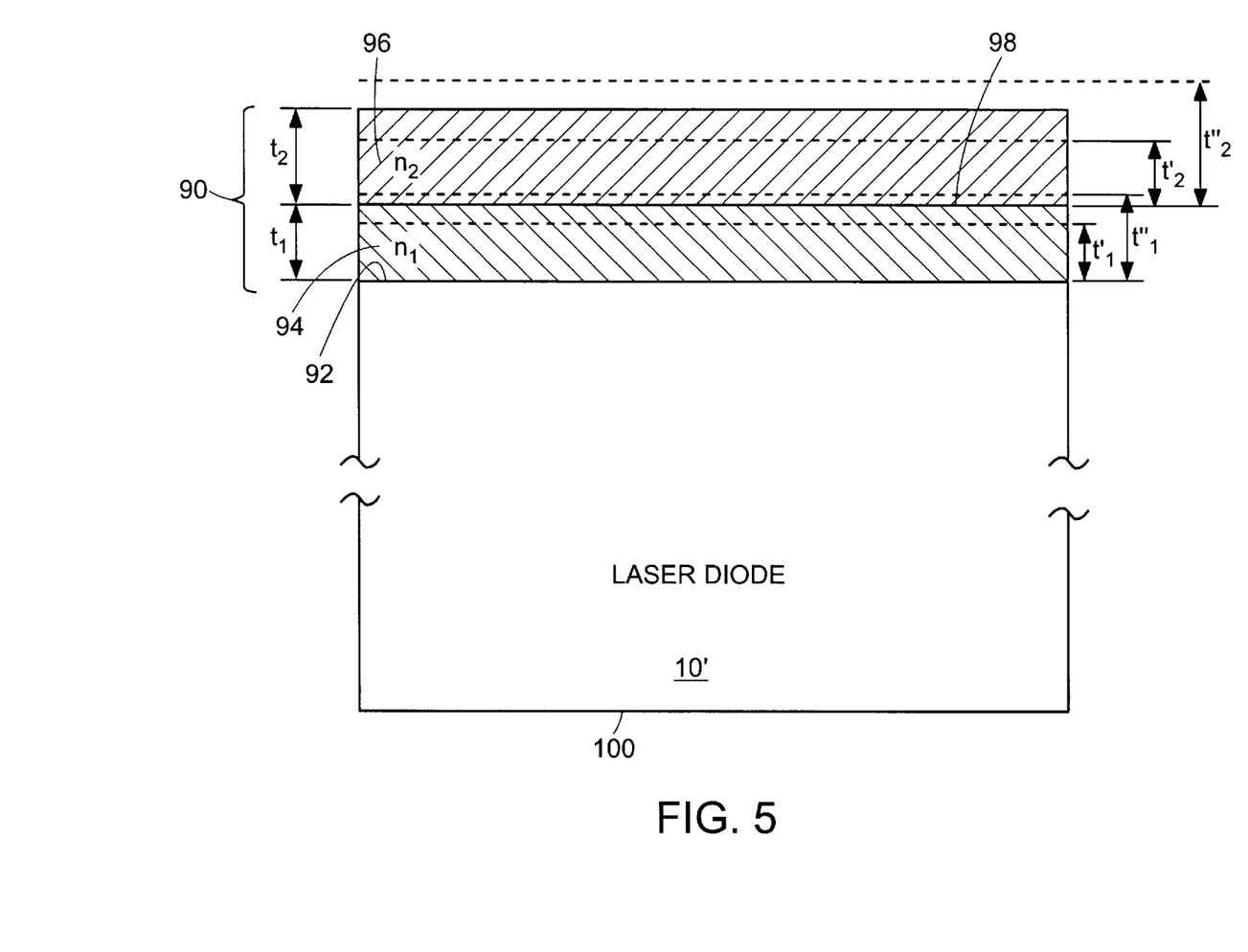
FIG. 5 is a cross-sectional view of a portion of an anti-reflection coated optical gain element according to the invention.

FIG. 5 shows the structure of a two layer anti-reflection coating 90 on one facet 92 of a laser diode 10'. The first layer 94 is made of aluminum oxide and has a refractive index $n_1$ at the operating wavelength. The first layer 94 is fabricated directly on the facet 92 at a thickness $t_1$. The second layer 96 is made of titanium oxide of thickness $t_2$ has a refractive index $n_2$ at the operating wavelength. The second layer 96 is generated on the surface 98 of the first layer 94 opposite the facet 92 of the laser diode 10'.

Figure 6:
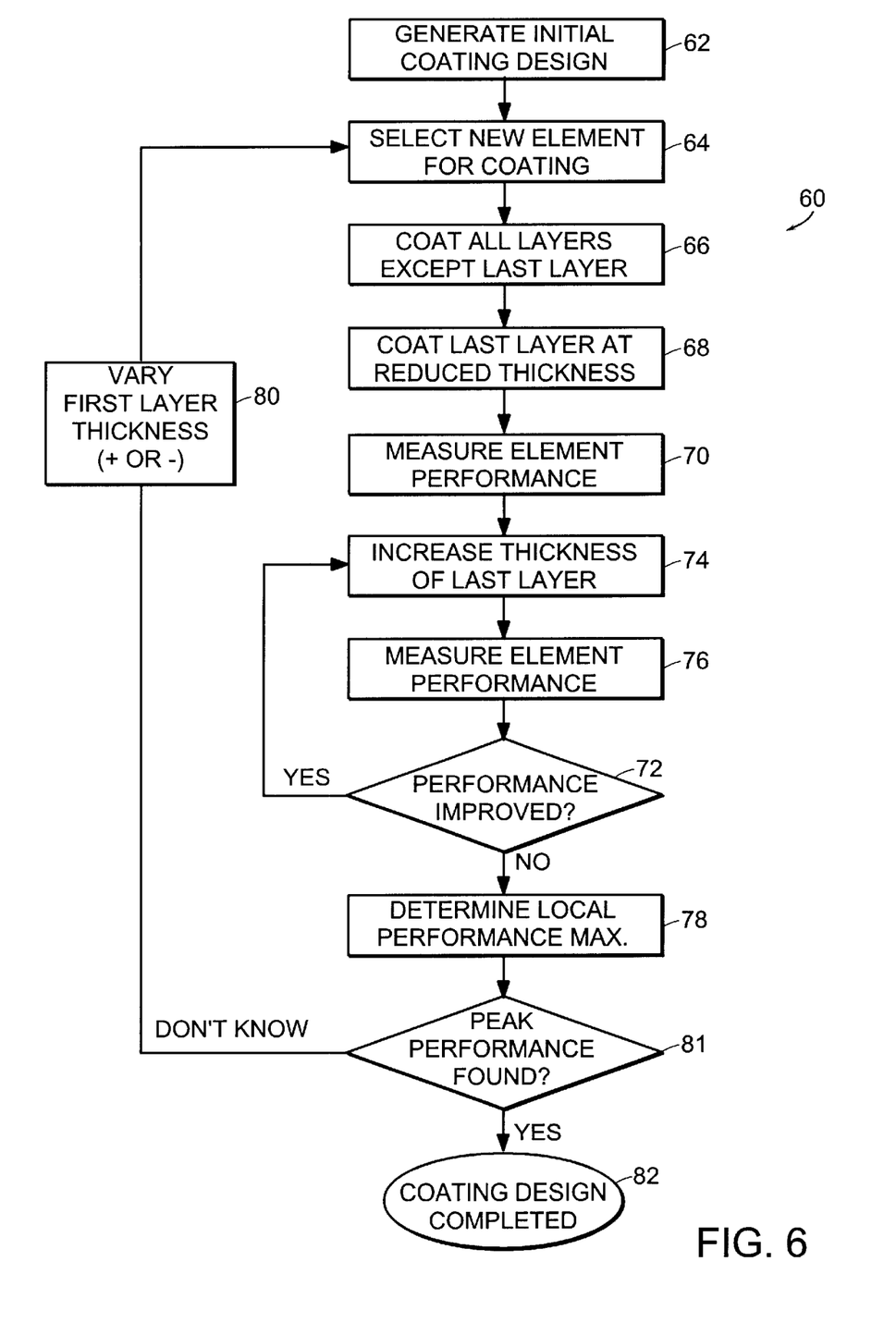
FIG. 6 is a flowchart representation of an illustrative method of generating an anti-reflection coating on an optical gain element according to one embodiment of the invention.

FIG. 6 is a flowchart showing a method 60 for generating an anti-reflection coating on an optical gain element, such as a laser diode, according to one embodiment of the invention. The method includes determining an initial set of coating parameters (i.e., an initial coating design) for an anti-reflection coating based on predetermined characteristics of the laser diode and/or performance characteristics for a system using the laser diode (step 62). Predetermined characteristics of the laser diode include, by way of examples, its operational wavelength range, the divergence characteristics of its output beam and its lasing threshold current. System characteristics depend on the particular system configuration and, by way of examples, include optical power, tuning range, side mode suppression and amplifier gain.

Referring to FIGS. 5 and 6, a laser diode 10' is selected to receive an anti-reflection coating 90 (step 64). The first coating layer 94 is deposited at a predetermined thickness $t_1$ which is, for example, 2% less than the thickness $t_1$ of the first coating layer 94 as defined by the initial coating parameters (step 66). The actual difference between $t_1$ and $t'_1$ is chosen to be greater (e.g., less than three times greater) than the repeatability in fabricating the first layer 94 to a thickness to. If the anti-reflection coating 90 has more than two layers (not shown), the intermediate layers (i.e., layers other than the first layer and the last layer) are fabricated sequentially onto previously generated layers (step 66).

The thickness of each coating layer 94, 96 is monitored real time by observing the reflection of an optical beam at a predetermined wavelength from a polished witness substrate. Preferably, the refractive index of the witness substrate is approximately the same as the refractive index of the laser diode 10'. For example, if a GaAs laser diode is being coated, then the substrate material preferably is also fabricated from GaAs. Preferably, the witness substrate is mounted close to the laser diode 10' so that the thickness of each of its coating layers accurately represents the thickness of each corresponding coating layer on the laser diode 10'. Unlike standard techniques commonly used to monitor the optical thickness of coatings, the witness substrate is not replaced between the fabrication of the individual layers. Fabrication of each coating layer (other than the first coating layer 94) is terminated when the energy detected in the reflected optical beam is minimized (i.e., the turning point is determined). Using this process for generating the layers fabricated after the first layer is fabricated effectively reduces the number of independent variables in the empirical portion of the design process to one, the first layer thickness $t_1$. Although the wavelength at which the second layer is monitored is also determined in the empirical portion of the design process, its value is dependent on the thickness $t_1$ of the first coating layer 94 due to the described turning point monitoring technique.

The last coating layer 96 is generated to a thickness $t'_2$ which is less than that specified in the initial coating parameters (step 68) and a performance of the laser diode 10' is measured (step 70). The last coating layer 96 is then generated to an increased thickness $t_2$ (step 74) and the performance of the laser diode 10' is again measured (step 76).

The performance can be any parameter that relates to operation of the laser diode 10' or, for a system utilizing a laser diode 10', a parameter that relates to overall system performance. Preferably, the coating system is a thermal evaporator configured for ion assisted deposition (IAD) and permits optical performance measurements to be made without the need to remove the laser diode 10' from the system. This avoids the delay inherent with some coating chambers (but not IAD systems) where the chamber must be vented, the diode 10' removed from the chamber for measurement, the diode 10' replaced in the chamber, and vacuum reestablished before the thickness $t_2$ of the last layer 96 can be increased. For thermal evaporator systems without IAD, the produced layers are porous and must be allowed to stabilize in the atmosphere before measuring the performance.

Generally, system performance can be predicted by measuring a performance of the laser diode 10'. For example, a laser diode 10 used in an external cavity configuration 16 requires low reflectance on at least one facet 24 for good performance (see FIG. 2). Because opposite facets 92, 100 of the laser diode 10' act as the mirrors of a cavity, measurement of the current I necessary to initiate lasing ($I_{th}$, the lasing threshold current) of the laser diode 10' can be used to determine improvements in performance of the anti-reflection coating on one or both facets 92, 100.

A determination is made as to whether the measured performance represents an improvement (step 72). An improvement is realized if the most recently measured performance is greater than previous measurements of performance for the laser diode 10'. If an improvement is observed, the method 60 proceeds to step 74 to increase the thickness $t_2$ of the last layer and to step 76 to measure the performance of the coated laser diode 10'. Steps 74 and 76 are repeated until a performance improvement is no longer realized (step 72) and the local performance maximum is determined (step 78). The method 60 continues to step 80 at which the first layer thickness $t'_1$ is varied (e.g., increased by 2% of the first layer design thickness $t_1$) and a corresponding first layer 94 is generated on a second laser diode 10' (steps 64 and 66). Steps 68 through 76 are repeated as described above until a second local performance maximum is determined (step 78). The method 60 continues to step 80 and the first layer thickness $t_1$ is either increased or decreased, depending on whether the last local performance measurement increased or decreased with the previous change in the first layer thickness $t_1$. A corresponding first coating layer 94 is generated on a third laser diode 10' (steps 64 and 66). Steps 68 through 76 are performed as described above until a third local performance maximum is determined (step 78). If comparison of the local performance maxima (step 81) indicates a global maximum then no further repetitions of method steps are required and the coating parameters corresponding to the coating for the global maximum (i.e., the improved coating parameters) are adopted as the completed design (step 82). A global maximum is determined when measurements indicate that further modifications to the first layer thickness $t_1$ within the fabrication error (typically about 1% to 2%) will not yield better performance. If no global maximum can be determined, the method steps are repeated as described above for another laser diode 10' until a global maximum can be determined.

Figure 7:
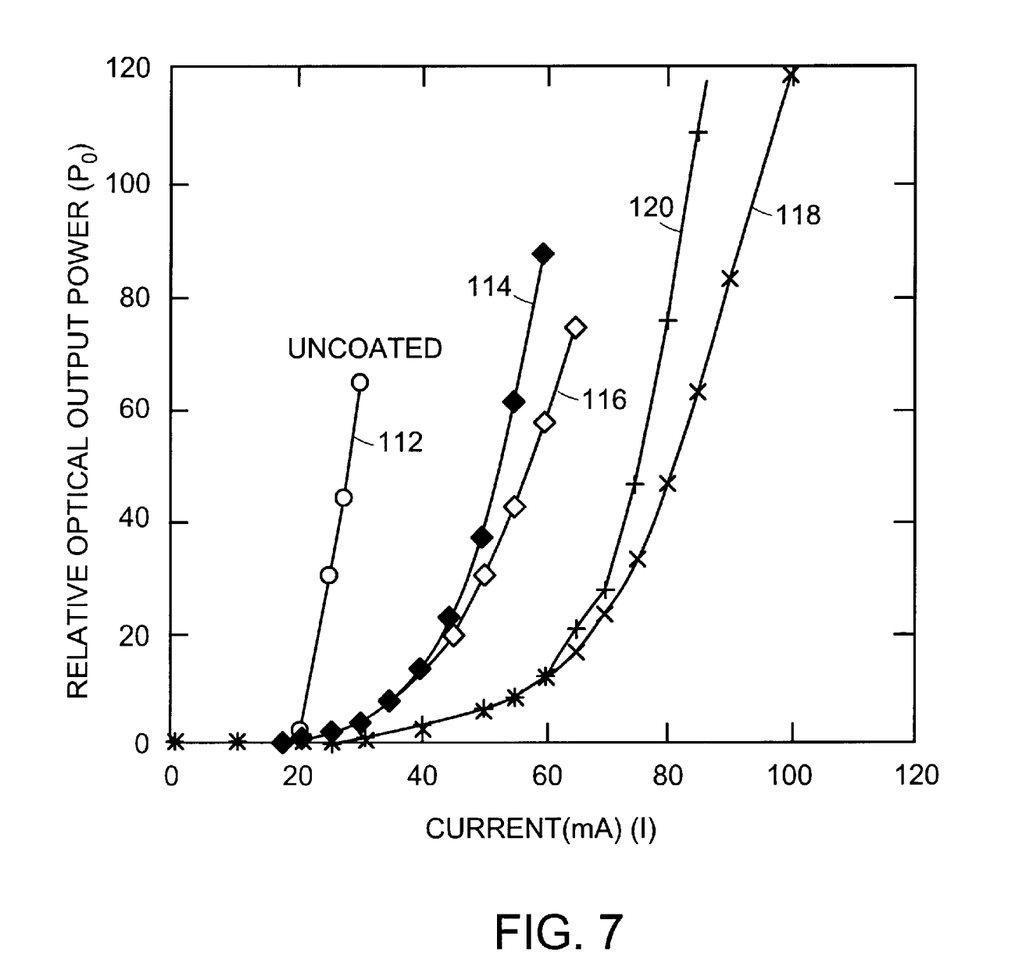
FIG. 7 is a graphical representation of an exemplary relationship of optical output power as a function of laser diode current and last layer coating thickness according to the invention.

FIG. 7 shows an exemplary plot of the optical output power $P_o$ as a function of the current I through the laser diode 10' of FIG. 5 for an anti-reflection coating 90 having different last layer thicknesses $t_2$. The lasing threshold current $I_{th}$ for the laser diode 10', defined as the minimum current I at which lasing is observed or, alternatively, as the minimum current I at which the maximum slope of the optical output power $P_o$ versus diode current I exists, can be used as a performance measurement. A relatively low $I_{th}$ is observed for the uncoated laser diode 10' and after a preliminary anti-reflection coating 90 is applied (curves 112 and 114, respectively). As the thickness of the last coating layer 96 is increased to $t'_2$, $t_2$ and $t''_2$, respectively, $I_{th}$ increases then decreases (curves 116, 118 and 120, respectively). The maximum $I_{th}$ corresponds to a last layer thickness $t_2$ (curve 118). Thus, a local performance maximum for the fixed first layer thickness $t_1$ occurs for a last layer thickness $t_2$.

For some laser diodes 10' such as multiple quantum well (MQW) laser diodes with short cavity lengths, the gain of the element 10' as a function of diode current I is sub-linear, especially at large laser diode currents I. However, other measurements of performance can be used with the method 60. In one embodiment, measuring the performance of the laser diode 10' includes measuring the modulation depth of the interfering modes in the optical spectrum of the optical output beam 12. In another embodiment, measuring the performance of the laser diode 10' includes monitoring the forward voltage across the laser diode 10'. Because the forward voltage changes abruptly at the onset of lasing, this electrical measurement is approximately equivalent to the optical measurement used to determine $I_{th}$.

Figure 8:
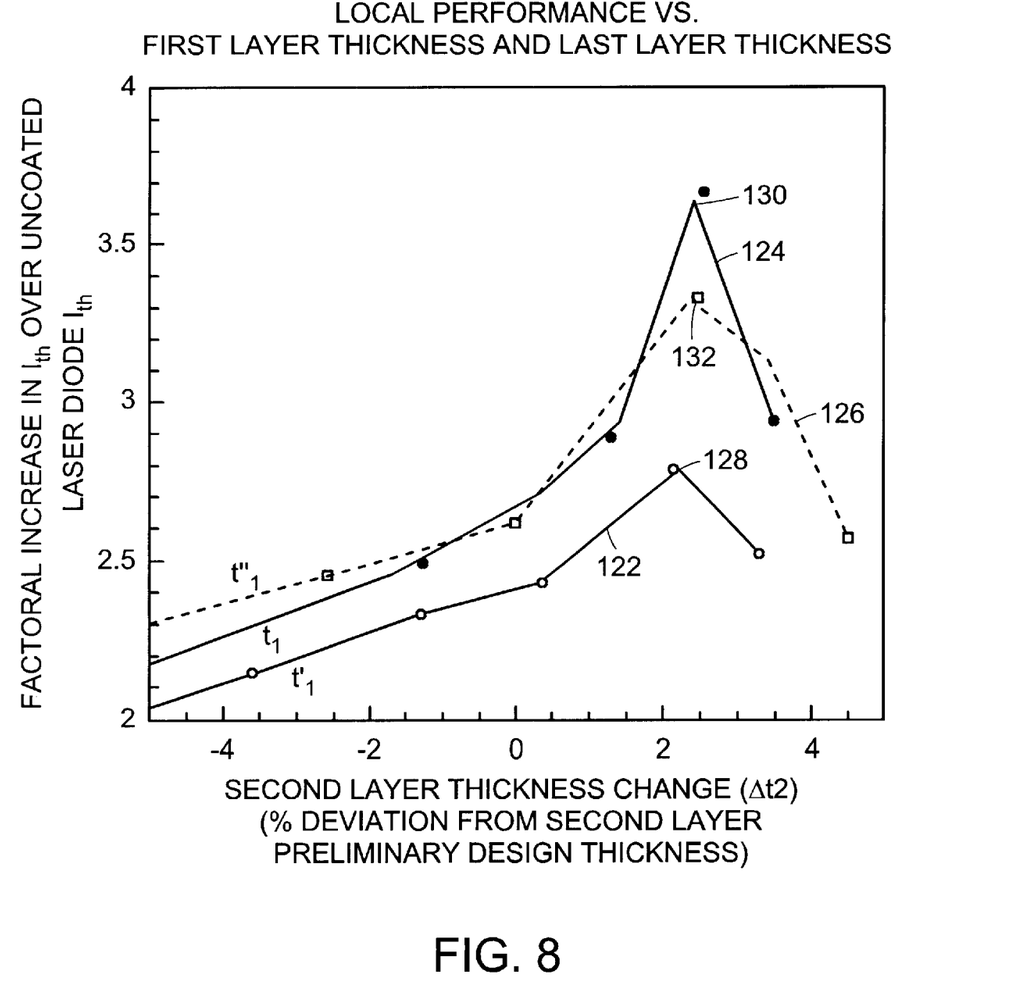
FIG. 8 is a graphical representation of an exemplary relationship of lasing threshold current factor as a function of last coating layer thickness for three laser diodes having different first layer coating thicknesses.

FIG. 8 shows an exemplary relationship of the factoral increase in $I_{th}$ (relative to an uncoated laser diode) as a function of both first and last layer thicknesses of an anti-reflection coating. Curves 122, 124 and 126 correspond to laser diodes 10' having unique first layer thicknesses $t'_1$, $t_1$ and $t''_1$, respectively. Each data point indicates the factoral in crease in $I_{th}$ at one second layer thickness $t_2$. The global maximum 130 is the largest of the local performance maxima 128, 130 and 132. Coating parameters corresponding to the global maximum 130 represent an improved design to be used in fabricating anti-reflection coatings on large quantities of similar laser diodes 10'.

It will thus be seen that the invention provides a unique method for determining an anti-reflection coating design for a laser diode. Since certain changes may be made in the above constructions and the described methods without departing from the scope of the invention, it is intended that all matter contained in the above description and shown in the accompanying drawings be interpreted as illustrative.

I claim:

1. A method of determining an improved anti-reflection coating for an optical gain element, the method comprising the steps of:

determining a preliminary coating parameter for a first layer and a preliminary coating parameter for a last layer of a preliminary anti-reflection coating in response to predetermined characteristics of a plurality of optical gain elements, each of said preliminary coating parameters comprising one of a physical thickness, an optical thickness, and a refractive index;

for said preliminary coating parameter and each of a series of variations of said preliminary coating parameter for said first layer on each of a respective one of said optical gain elements, varying said preliminary coating parameter for each last layer of said plurality of optical gain elements to generate a plurality of modified anti-reflection coatings on said plurality of optical gain elements;

measuring a perforce characteristic of said plurality of modified anti-reflection coatings for each of said variations of said last layer on said plurality of optical gain elements; and determining a coating parameter for a first layer and a coating parameter for a last layer of said improved anti-reflection coating in response to said measurements of said performance characteristics of said modified anti-reflection coatings.

2. The method of claim 1 wherein the step of measuring a performance characteristic comprises measuring a performance characteristic of said plurality of modified anti-reflection coatings at an operating wavelength of a respective one of said plurality of optical gain elements for each of said variations of said last layer on said plurality of optical gain elements.

3. The method of claim 1 wherein the step of measuring a performance characteristic comprises measuring a lasing threshold current of a respective one of said plurality of modified anti-reflection coatings for each of said variations of said last layer on said plurality of optical gain elements.

4. The method of claim 1 wherein the step of measuring a performance characteristic comprises measuring an electrical characteristic of a respective one of said plurality of modified anti-reflection coatings for each of said variations of said last layer on said plurality of optical gain elements.

5. The method of claim 4 wherein the step of measuring a performance characteristic comprises measuring a forward voltage of a respective one of said plurality of modified anti-reflection coatings for each of said variations of said last layer on said plurality of optical gain elements.

6. The method of claim 1 wherein the step of measuring a performance characteristic comprises measuring a modulation depth of modes in an optical spectrum of a respective one of said plurality of modified anti-reflection coatings for each of said variations of said last layer on said plurality of optical gain elements.

7. The method of claim 1 wherein determining a preliminary coating parameter comprises:

calculating an effective reflectivity of said preliminary anti-reflection coating for an angular intensity distribution of said plurality of optical gain elements in response to said first and said second preliminary coating parameters;

comparing said effective reflectivity with an acceptable reflectivity; and recalculating said effective reflectivity by varying said first preliminary coating parameter and said second preliminary coating parameters if said effective reflectivity exceeds said acceptable reflectivity.

8. A method of generating an anti-reflection coating on an optical gain element, comprising:

determining a plurality of coating parameters for a first anti-reflection coating having a first coating layer and a last coating layer in response to predetermined characteristics of said optical gain element;

fabricating an anti-reflection coating on a first optical gain element according to said plurality of coating parameters;

measuring a performance characteristic of said first-element anti-reflection coating on said first optical gain element;

increasing a thickness of said last coating layer of said first-element anti-reflection coating on said first optical gain element;

measuring said performance characteristic of said first-element anti-reflection coating on said first optical gain element;

determining a local performance maximum of said first optical gain element based, at least in part, on said measurement of said performance characteristic of said first-element anti-reflection coating on said first optical gain element;

modifying a thickness of said first coating layer for a second optical gain element to generate a modified plurality of coating parameters;

fabricating an anti-reflection coating having a last coating layer on said second optical gain element according to said modified plurality of coating parameters;

measuring a performance characteristic of said second-element anti-reflection coating on said second optical gain element;

increasing a thickness of said last coating layer of said second-element anti-reflection coating on said second optical gain element;

measuring said performance characteristic of said second-element anti-reflection coating on said second optical gain element; and determining a local performance maximum for said second optical gain element based, at least in part, on said measurement of said performance characteristic of said second-element anti-reflection coating on said second optical gain element.

9. The method of claim 8 further comprising determining a plurality of improved coating parameters in response to said local performance maximum for said first optical gain element and said local performance maximum for said second optical gain element.

10. The method of claim 9 further comprising fabricating an anti-reflection coating on a third optical gain element according to said plurality of improved coating parameters.

* * * * *